(12) United States Patent
Takei et al.

(10) Patent No.: US 7,901,785 B2
(45) Date of Patent: Mar. 8, 2011

(54) RESIN COMPOSITION FOR SEALING LIGHT-EMITTING DEVICE AND LAMP

(75) Inventors: Tomoyuki Takei, Ichihara (JP); Hiroshi Uchida, Ichihara (JP)

(73) Assignee: Showa Denko K.K., Tokyo (JP)

( * ) Notice: Subject to any disclaimer, the term of this patent is extended or adjusted under 35 U.S.C. 154(b) by 183 days.

(21) Appl. No.: 12/303,347

(22) PCT Filed: Dec. 26, 2007

(86) PCT No.: PCT/JP2007/075014
§ 371 (c)(1),
(2), (4) Date: Dec. 3, 2008

(87) PCT Pub. No.: WO2008/081836
PCT Pub. Date: Jul. 10, 2008

(65) Prior Publication Data
US 2009/0256171 A1    Oct. 15, 2009

(30) Foreign Application Priority Data

Dec. 28, 2006  (JP) .................................. 2006-356533
Jun. 1, 2007   (JP) .................................. 2007-146749

(51) Int. Cl.
*C08L 83/06* (2006.01)
*C08L 63/00* (2006.01)

(52) U.S. Cl. ......... 428/447; 524/430; 524/431; 524/497; 525/476

(58) Field of Classification Search ........................ None
See application file for complete search history.

(56) References Cited

U.S. PATENT DOCUMENTS

| 6,521,677 | B2 | 2/2003 | Yashiro et al. | |
| 6,743,510 | B2* | 6/2004 | Ochiai | 428/413 |
| 2008/0121845 | A1* | 5/2008 | Mills et al. | 252/500 |
| 2010/0006887 | A1* | 1/2010 | Takei et al. | 257/100 |
| 2010/0041146 | A1* | 2/2010 | Kambayashi et al. | 435/383 |

FOREIGN PATENT DOCUMENTS

| JP | 05-315652 A | | 11/1993 |
| JP | 2000-049387 A | | 2/2000 |
| JP | 2000-143924 A | | 5/2000 |
| JP | 2005-089601 A | | 4/2005 |
| JP | 2005-161111 A | | 6/2005 |
| JP | 2005-206787 A | * | 8/2005 |
| JP | 2005-290141 A | | 10/2005 |
| JP | 2006-111823 A | | 4/2006 |
| JP | 2006-176586 A | | 7/2006 |
| JP | 2007-001995 A | | 1/2007 |
| JP | 2007-217242 A | | 8/2007 |
| WO | 2007/049573 A1 | | 5/2007 |

OTHER PUBLICATIONS

Machine translation of JP2005-206787.*

* cited by examiner

*Primary Examiner* — Marc S Zimmer
(74) *Attorney, Agent, or Firm* — Sughrue Mion, PLLC

(57) ABSTRACT

A resin composition for sealing a light-emitting device of the present invention includes a silsesquioxane resin including two or more oxetanyl groups, a cationic polymerization initiator and a metal oxide fine particle. Furthermore, a lamp of the present invention includes a package equipped with a sealing member, an electrode exposed in the bottom portion of the sealing member, and a light-emitting device arranged on the bottom portion and electrically connected with the electrode, wherein the light-emitting device is sealed with the resin composition for sealing a light-emitting device filled in the sealing member.

6 Claims, 1 Drawing Sheet

US 7,901,785 B2

RESIN COMPOSITION FOR SEALING LIGHT-EMITTING DEVICE AND LAMP

TECHNICAL FIELD

The present invention relates to a resin composition for sealing a light-emitting device, which is suitably used for sealing a light-emitting device used in displays, back-light light sources, lightings, signaling units, various types of indicators, and the like, and to a lamp in which a light-emitting device is sealed with the resin composition for sealing a light-emitting device.

Priority is claimed on Japanese Patent Application No. 2006-356533, filed Dec. 28, 2006, and Japanese Patent Application No. 2007-146749, filed Jun. 1, 2007, the contents of which are incorporated herein by reference.

BACKGROUND ART

A light-emitting diode (which hereinafter may also be referred to as "LED") is generally formed by arranging an LED device on the bottom portion of a cup-shaped sealing member in a package, and sealing it with a sealing resin. Conventionally, as an LED sealing resin, a light-transmitting resin including an epoxy resin, a silicone resin, or the like is used.

It is believed that an LED sealing resin has better light extraction efficiency as it has less of a difference in the refractive index from an LED device according to Snell's Law. For this reason, as an LED sealing resin, those resins having higher refractive index are preferably used.

Examples of a sealing resin having a high refractive index include resins having an aromatic ring such as a phenyl group in the skeleton, such as an epoxy resin. However, an aromatic ring causes a problem in that coloration occurs by oxidation under UV excitation.

Furthermore, since a resin having a heavy atom such as sulfur has a high refractive index, there has been proposed that a resin having a high refractive index and containing sulfur is coated onto a light extraction surface of a light-emitting device (see, for example, Patent Document 1). However, a sulfur compound causes a problem in that coloration occurs on Ag plating or coloration occurs by a thermal decomposition.

Furthermore, it has been known that it is possible to improve the refractive index of a resin while maintaining its transparency by dispersing fine particles having high refractive indexes in a resin to make a resin composition. For example, Patent Document 2 describes a liquid curable resin composition which contains a multifunctional (meth)acrylic compound, a reaction product obtained by reacting a compound having a polymerizable unsaturated group and an alkoxysilane group in the molecule with the oxide particles of a metal, and a radiation polymerization initiator.

[Patent Document 1] Japanese Unexamined Patent Application, First Publication No. 2000-49387

[Patent Document 2] Japanese Unexamined Patent Application, First Publication No. 2000-143924

DISCLOSURE OF THE INVENTION

Problems to be Solved by the Invention

However, the liquid curable resin composition as described in Patent Document 2 has a problem in that since it contains a solvent, a sufficient thickness cannot be obtained upon curing, and accordingly, cracks are easily generated in a case where it is used as an LED sealing resin, or a problem in that the light resistance is not sufficient. For this reason, an LED in which an LED device is sealed with the liquid curable resin composition as described in Patent Document 2 is required to have improved light resistance, together with an improved production yield upon curing a sealing resin.

Furthermore, as a resin having excellent heat resistance and light resistance, a silicone resin having an Si—O skeleton may be mentioned. However, the silicone resin has a refractive index as low as about 1.4 to 1.5. Furthermore, since the silicone resin has high water repellency and oil repellency, fine particles agglomerate in a resin composition obtained when fine particles having a high refractive index are contained in a silicone resin, thereby giving secondary particles having a large particle diameter. Accordingly, a resin composition, which is including fine particles having a high refractive index in a silicone resin, develops a white turbidity due to the light scattering by the secondary particles, and accordingly, insufficient transparency is given when it is used as an LED sealing resin.

The present invention has been made to address the above-described problems, and an object of which is to provide a resin composition for sealing a light-emitting device, which is transparent, has a high refractive index, and has excellent light resistance without generating cracks during the curing.

Furthermore, another object is to provide a lamp in which a light-emitting device is sealed with the resin composition for sealing a light-emitting device, having an excellent light extraction efficiency, and accordingly, it can be prepared with a good product yield.

Means for Solving the Problems

The present inventors have studied extensively in order to solve the above-described problems, thereby completing the present invention. That is, the present invention is as follows.

(1) A resin composition for sealing a light-emitting device, which includes a silsesquioxane resin including two or more oxetanyl groups, a cationic polymerization initiator, and a metal oxide fine particle.

Furthermore, the present invention is preferably as follows.

(2) The resin composition for sealing a light-emitting device according to (1), further including an aliphatic hydrocarbon including one or more epoxy groups.

(3) The resin composition for sealing a light-emitting device according to (1) or (2), wherein the concentration of the metal oxide fine particle in the resin composition for sealing a light-emitting device is in a range of 10 to 80% by mass.

(4) The resin composition for sealing a light-emitting device according to any one of (1) to (3), wherein the average particle diameter of the metal oxide fine particle is in a range of 1 nm to 20 mn.

(5) The resin composition for sealing a light-emitting device according to any one of (1) to (4), wherein the metal oxide fine particle includes a metal oxide having a refractive index of 1.8 or more.

(6) The resin composition for sealing a light-emitting device according to any one of (1) to (5), wherein the metal oxide fine particle includes a metal oxide having a transmittance in the visible light region of 80% or more.

(7) The resin composition for sealing a light-emitting device according to any one of (1) to (6), wherein the metal oxide fine particle is surface-modified with an organic group.

In addition, the present invention is as follows.

(8) A lamp which includes a package having a sealing member, an electrode exposed in the bottom portion of the sealing member, and a light-emitting device arranged on the bottom portion and electrically connected with the electrode, wherein the light-emitting device is sealed with the resin composition for sealing a light-emitting device filled in the sealing member, and the resin composition for sealing a light-emitting device according to any one of (1) to (7) is used as the resin composition for sealing a light-emitting device.

Effects of the Invention

By the resin composition for sealing a light-emitting device of the present invention, there can be provided a resin composition for sealing a light-emitting device, which is transparent, has a high refractive index, and has excellent light resistance without generating cracks during the curing.

Furthermore, in the lamp of the present invention, a light-emitting device is sealed with the resin composition for sealing a light-emitting device, and accordingly, the lamp can be prepared in a good product yield and the cracks are hardly generated upon curing the sealing resin. In addition, in the lamp of the present invention, a light-emitting device is sealed with the resin composition for sealing a light-emitting device which is transparent, has a high refractive index, and has excellent light resistance, and accordingly, the lamp has excellent light extraction efficiency, thereby giving high reliability.

Figure 1A:
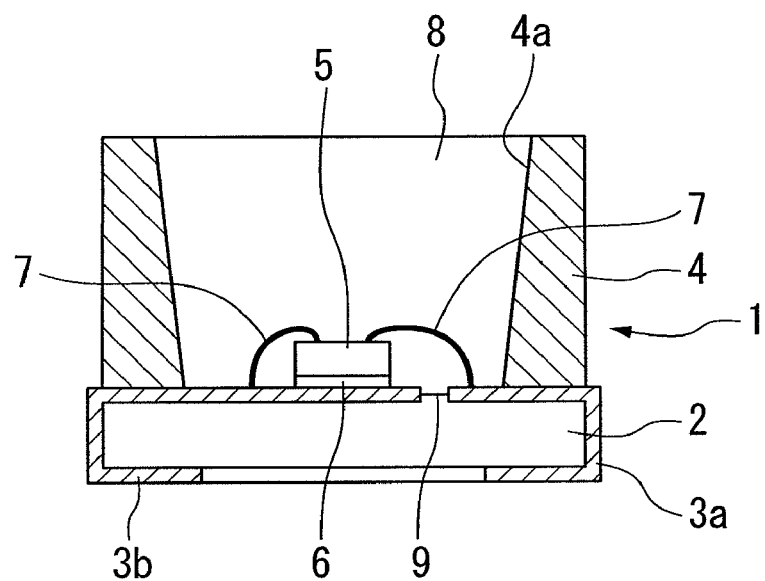
FIG. 1A is a cross-sectional diagram schematically showing an example of a lamp of the present invention.

The reference symbols shown in these figures are defined as follows:

1 ... Package, 2 ... Substrate, 3a ... First electrode, 3b ... Second electrode, 4 ... Package shaped product, 4a ... Sealing member, 5 ... LED device, 6 ... Die attach paste, 7 ... Wire

BEST MODE FOR CARRYING OUT THE INVENTION

Hereinbelow, the resin composition for sealing a light-emitting device and the lamp of the present invention will be described in detail.

(Resin Composition for Sealing a Light-Emitting Device)

The resin composition for sealing a light-emitting device of the present invention includes a silsesquioxane resin having two or more oxetanyl groups, a cationic polymerization initiator, and a metal oxide fine particle that is preferably surface-modified with an organic group.

[Silsesquioxane resin]

As the silsesquioxane resin, those having two or more oxetanyl groups are used. Specific examples thereof include a silsesquioxane resin having a cage-type skeleton, represented by the following General Formula (1).

[Formula 1]

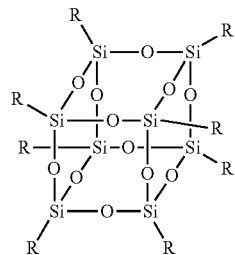

(1)

In the General Formula (1), as long as R has two or more skeletons having oxetanyl groups represented by the following General Formula (2), R may be one kind of structure, or two or more kinds of structures.

[Formula 2]

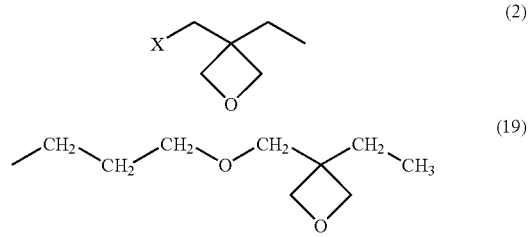

In the General Formula (2), X is an organic chain between the Si atom of the silsesquioxane and the oxetanyl group, and represents —(CH$_2$)$_n$O—, —(CH$_2$)$_n$—, or —(CH$_2$)$_n$COO— (n=1 to 6).

Specific examples of the oxetanyl groups represented by the General Formula (2) include those which may be represented by General Formula (19). Furthermore, there may be any one of those in which a part of a plurality of Rs contain no oxetanyl group such as —CH$_3$, as long as two or more Rs among the plurality of Rs shown in General Formula (1) contain oxetanyl groups.

Moreover, the skeleton of the silsesquioxane resin may be in any form of a cage type represented by the following General Formula (3) or (4), a ladder type represented by the following General Formula (5), a random type represented by the following General Formula (6), and a partially cleaved cage type represented by the following General Formula (7), in addition to a cage type represented by the General Formula (1).

[Formula 3]

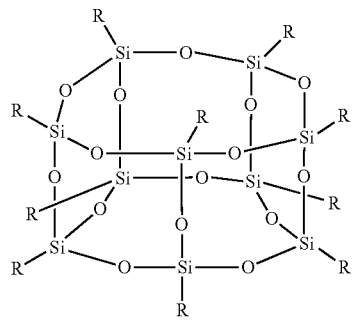

(3)

-continued

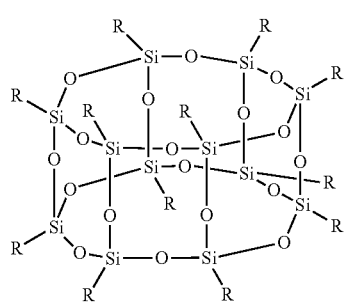

[Formula 4]

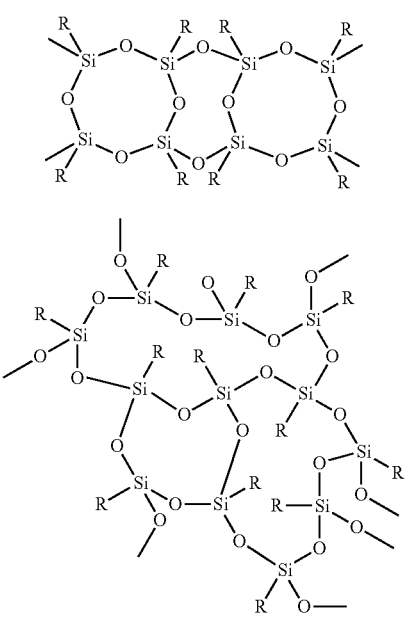

[Formula 5]

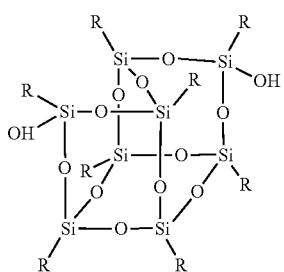

In the General Formulae (3) to (7), as long as R has two or more skeletons having oxetanyl groups represented by the following General Formula (2), R may be one kind of structure, or two or more kinds of structures.

Specific examples of the oxetanyl groups represented by the General Formula (2) include those which may be represented by General Formula (19). Furthermore, there may be any one of those in which a part of a plurality of Rs contain no oxetanyl group such as —$CH_3$, as long as two or more Rs among the plurality of Rs in General Formulae (3) to (7) contain oxetanyl groups.

Furthermore, the skeleton of the silsesquioxane resin may have one kind of structure among the above-mentioned structures, or two or more kinds of structures.

[Cationic Polymerization Initiator]

As the cationic polymerization initiator, a heat latent cationic polymerization initiator can be used, and among them, an onium salt having ion pairs of $PF_6^-$ or $SbF_6^-$ is preferred. Examples of the cationic structure include those represented by the following General Formulae (15) to (17).

[Formula 8]

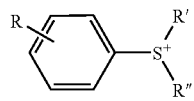

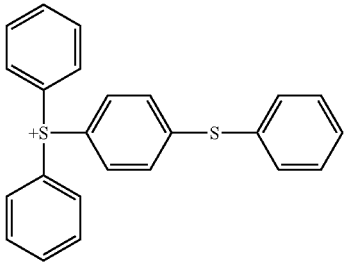

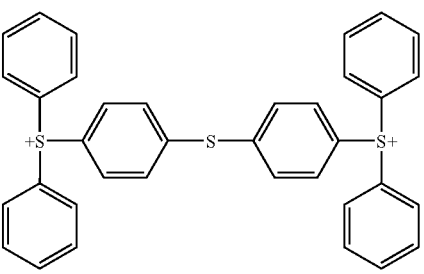

More specifically, as the cationic polymerization initiator, San-Aid SI series manufactured by Sanshin Chemical Industry Co., Ltd. that are onium salts having ion pairs of $PF_6^-$ or $SbF_6^-$, Adeka Optomer CP series, or the like can be used.

[Metal Oxide Fine Particle that is Modified with Organic Group]

As the metal oxide fine particle that is modified with an organic group, a metal oxide fine particle in which the surface is modified with an organic group is used. In the present invention, "the metal oxide fine particle in which the surface is modified with an organic group" refers to a state in which a surface treating agent having both of a functional group showing high reactivity with inorganics and an organic group, such as a silane coupling agent and a titanate coupling agent, is chemically bonded to a metal oxide fine particle by undergoing a reaction therebetween, or a state in which they are in a strong interaction through hydrogen bonds or physical adsorption.

Examples of the organic group include a vinylsilyl group, a 3-glycidoxylpropylsilyl group, and a 2-(3,4-epoxycyclohexyl)ethylsilyl group.

As the metal oxide fine particle, a fine particle which includes a metal oxide having a transmittance in the visible light region of 80% or more is preferably used. Examples of the metal oxide having a transmittance in the visible light region of 80% or more include zirconium oxide, titanium oxide, zinc oxide, tin oxide, ITO, and silica. Among them, zirconium oxide, titanium oxide, zinc oxide, tin oxide, and ITO, each of which is a metal oxide having a refractive index of 1.8 or more, are preferably used.

The average particle diameter of the metal oxide fine particle that is modified with an organic group is preferably in a range of 1 nm to 20 nm, more preferably in a range of 1 nm to 10 nm. If the average particle diameter of the metal oxide fine particle that is modified with an organic group is less than 1 nm, the specific surface area increases, and accordingly, the content of the surface organic component increases, and the content of the metal oxide component decreases, which may interfere with an effect of improvement in the refractive index.

Furthermore, if the average particle diameter of the metal oxide fine particle that is modified with an organic group is more than 20 nm, the resin composition for sealing a light-emitting device becomes opaque, and accordingly, in a case where it is used as an LED sealing resin, its transparency may not be sufficient in some cases.

Furthermore, the metal oxide fine particle that is modified with an organic group may either be used in a form of powder or in a form of dispersion liquid in which the metal oxide fine particle that is modified with an organic group is dispersed in a solvent. Examples of the solvent as used herein include water, methyl ethyl ketone, toluene and the like.

Furthermore, as the metal oxide fine particle that is modified with an organic group, specifically, a nano zirconium oxide dispersion liquid (trade name: NZD8J61 (manufactured by Sumitomo Osaka Cement Co., Ltd.)) using zirconium oxide with a particle size of 3 nm to 10 nm (refractive index 2.2), that is a metal oxide fine particle, or the like, can be used.

In order to prepare such an organic group-modified metal oxide fine particle, the surface of a metal oxide particle is modified with an organic group by employing, for example, a method which includes adding a solution of a silane coupling agent adjusted to be acidic to a dispersion liquid of metal oxide fine particles followed by stirring and heating (a dipping/heating method), a method which includes adding a silane coupling agent to a metal oxide fine particle while stirring, and then drying (a dry stirring method), a method which includes adding a metal oxide fine particle and a silane coupling agent instead of an organic group-modified metal oxide fine particle when mixing a silsesquioxane resin with an organic group-modified metal oxide fine particle (an Integrals Blend method), or the like.

The concentration of the metal oxide fine particle that is modified with an organic group in the resin composition for sealing a light-emitting device is preferably adjusted such that the concentration of the metal oxide fine particle in the resin composition for sealing a light-emitting device is in a range of 10% by mass to 80% by mass. If the concentration of the metal oxide fine particle in the resin composition for sealing a light-emitting device is less than 10% by mass, an effect of improving the refractive index by incorporation of a metal oxide fine particle may not be sufficiently obtained in some cases. Furthermore, if the concentration of the metal oxide fine particle in the resin composition for sealing a light-emitting device is more than 80% by mass, the resin composition for sealing a light-emitting device becomes opaque, and accordingly, if it is used as an LED sealing resin, its transparency may not be sufficient in some cases.

[Aliphatic Hydrocarbon]

In addition to the above-described components, an aliphatic hydrocarbon is preferably added to the resin composition for sealing a light-emitting device of the present invention.

As the aliphatic hydrocarbon, those including one or more epoxy groups are preferably used, and those including cyclohexene oxide groups and having 2 or more reactive cyclic ethers are preferred. Examples of the reactive cyclic ethers include an epoxy group and an oxetanyl group, and examples of the aliphatic hydrocarbon including cyclohexene oxide groups and having 2 or more reactive cyclic ethers include a 3,4-epoxycyclohexylcarboxylic acid-3,4-epoxycyclohexylmethyl ester (trade name: Celloxide 2021P (manufactured by Daicel Co., Ltd.)) represented by the following General Formula (8), a 3,4-epoxycyclohexanecarboxylic acid-3-ethyl-3-oxetanylmethylester (manufactured by Showa Denko K.K.) represented by the following General Formula (9), an adipic acid-bis-3,4-epoxycyclohexylmethylester represented by the following General Formula (10), and a diepoxylimonene represented by the following General Formula (11).

[Formula 6]

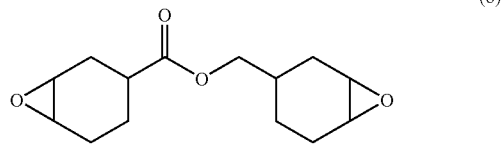
(8)

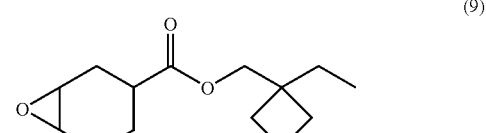
(9)

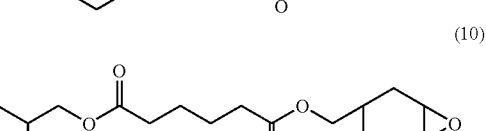
(10)

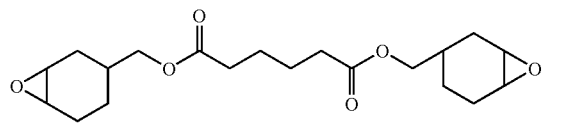

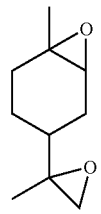
(11)

Furthermore, examples of the aliphatic hydrocarbon including no cyclohexene oxide group, which has 2 or more reactive cyclic ethers include 1,4-butanediol diglycidylether represented by the following General Formula (12), 1,6-hexandiol diglycidylether represented by the following General Formula (13), diethylglycol glycidylether represented by the following General Formula (14), and the like.

[Formula 7]

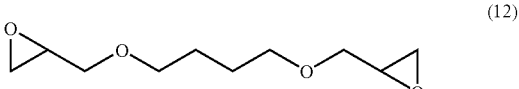
(12)

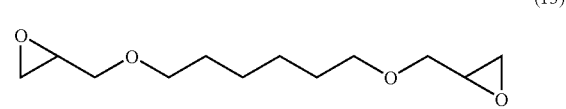
(13)

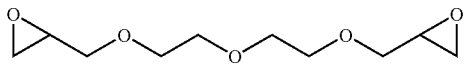

(14)

The content of the aliphatic hydrocarbon in the resin composition for sealing a light-emitting device is preferably in a range of 10% by mass to 60% by mass, more preferably in a range of 20% by mass to 60% by mass, and particularly preferably in a range of 30% by mass to 50% by mass. If the content of the aliphatic hydrocarbon is less than 10% by mass, the sufficient adhesion with a metal may not be obtained in some cases, or generation of cracks upon curing may not be sufficiently prevented in some cases. Furthermore, if the content of the aliphatic hydrocarbon is more than 60% by mass, the light resistance or the heat resistance may not be sufficient in some cases.

[Additives]

In addition to the above-described components, if desired, additives such as a phosphor, a light scattering agent, an antioxidant, and a UV shielding agent can be added to the resin composition for sealing a light-emitting device of the present invention.

The resin composition for sealing a light-emitting device of the present invention can be prepared, for example, by a method which includes mixing a silsesquioxane resin and a metal oxide fine particle that is modified with an organic group, and an aliphatic hydrocarbon or other additives which may be contained, if desired, removing the dispersing solvent by means of a rotary evaporator or the like, and then adding a cationic polymerization initiator to carry out stirring-defoaming under reduced pressure, or other methods.

The resin composition for sealing a light-emitting device in the present embodiment contains a silsesquioxane resin, a cationic polymerization initiator, and a metal oxide fine particle that is modified with an organic group, and accordingly, it is transparent, has a high refractive index, and has excellent light resistance since the cracks are hardly generated upon curing.

Furthermore, if the resin composition for sealing a light-emitting device in the present embodiment contains an aliphatic hydrocarbon, it has excellent light resistance or heat resistance, and cracks are hardly generated upon more severe curing.

(Lamp)

In the lamp of the present invention, a light-emitting device is sealed with the resin composition for sealing a light-emitting device of the present invention.

Figure 1B:
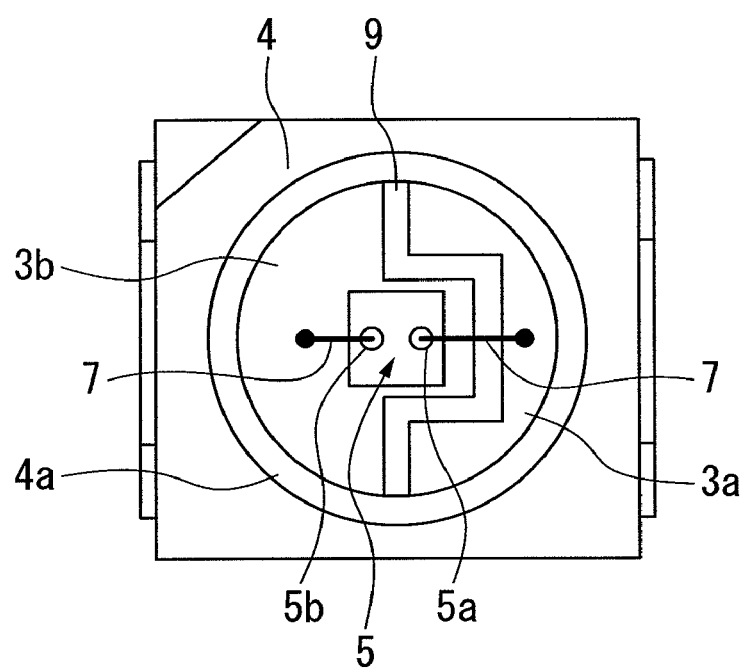
FIG. 1B is a planar diagram schematically showing an example of the lamp of the present invention.

FIGS. 1A and 1B are each a diagram schematically showing an example of the lamp of the present invention. FIG. 1A is a cross-sectional diagram and FIG. 1B is a planar diagram. In FIG. 1A, Symbol 1 denotes a package. This package 1 includes a substrate 2, a first electrode 3a, a second electrode 3b, and a package shaped product 4 including a sealing member 4a as shown in FIGS. 1A and 1B.

As the package shaped product 4, for example, those including a white heat resistance resin composed of polyphthalamide, polyphenylenesulfide, or the like are used. Furthermore, the sealing member 4a of the package shaped product 4 has a bowl shape (cup shape) in a plane view as shown in FIGS. 1A and 1B, and the first electrode 3a and the second electrode 3b that are electrically insulated by a band-shaped insulating region 9 of the substrate 2 are exposed to the bottom portion of the sealing member 4a, as shown in FIG. 1B. For the first electrode 3a and the second electrode 3b, for example, those obtained by plating a noble metal such as Au and Ag on a base metal such as a Cu or Cu-based alloy, a Fe-based alloy, and Ni can be suitably used.

Furthermore, a surface mount LED device 5 is adhered to the second electrode 3b that is exposed to the bottom portion of the sealing member 4a by a die attach paste 6, as shown in FIGS. 1A and 1B. As shown in FIG. 1B, an anode bonding pad 5a and a cathode bonding pad 5b that are each composed of Au, Al, Ni, Cu, or the like, are provided in LED device 5 and electrically connected with the first electrode 3a and the second electrode 3b through wires 7 and 7 composed of Al or the like. Furthermore, the resin composition 8 for sealing a light-emitting device of the present invention is filled and sealed in the sealing member 4a.

For the lamp shown in FIGS. 1A and 1B, sealing of the LED device 5 is done by a method including discharging liquid droplets of the resin composition 8 for sealing a light-emitting device of the present invention by a dispenser thereby filling into the sealing member 4a, and curing the resin composition 8 for sealing a light-emitting device by heating.

The thermal curing temperature as used herein can be from 120° C. to 180° C., and the thermal curing time can be from 2 to 6 hours. In addition, the thermal curing as used herein may be, for example, a two-step heat treatment including a first heat treatment for carrying out heat treatment at a low temperature for a short period of time, and a second heat treatment for carrying out heat treatment at a higher temperature for a longer period of time than the first heat treatment. In this case, the heat treatment temperature for the first heat treatment can be from 70° C. to 100° C., and the heat treatment time can be from 10 minutes to 2 hours. Further, the heat treatment temperature for the second heat treatment can be from 120° C. to 180° C., and the heat treatment time can be from 2 hours to 6 hours. If the thermal curing temperature is higher than 180° C., the white resin of the reflector of the package shaped product 4 may be colored in some cases, whereas if the thermal curing temperature is lower than 120° C., the curing may be insufficiently obtained in some cases.

In the lamp of the present invention, since the LED device 5 is sealed with the resin composition 8 for sealing a light-emitting device of the present invention, cracks are hardly generated upon curing the sealing resin, and accordingly, the lamp can be prepared in a good product yield. Furthermore, in the lamp of the present invention, since the LED device 5 is sealed with the resin composition 8 for sealing a light-emitting device of the present invention, which is transparent, has a high refractive index and excellent light resistance, the lamp has excellent light extraction efficiency, thereby providing high reliability.

EXAMPLE 1

The components as described below except for the cationic polymerization initiator were mixed, the dispersion solvent was then removed by means of a rotary evaporator or the like, the cationic polymerization initiator mentioned below was added thereto, and the stirring-defoaming process was carried out at 1200 rpm for 5 mins under reduced pressure by means of a vacuum stirring-defoamer to prepare a resin composition of Example 1.

<Components>

0.67 g of oxetanyl silsesquioxane (trade name: OX-SQ-Si2O (manufactured by Toagosei Co., Ltd.) as the silsesquioxane resin; 0.33 g of an alicyclic epoxy (trade name: Celloxide 2021P (manufactured by Daicel Co., Ltd.)) as the aliphatic hydrocarbon; 14 g of a nano zirconium oxide dispersion (trade name: NZD8J61 (manufactured by Sumitomo Osaka Cement Co., Ltd.)) as the metal oxide fine particle that is modified with an organic group; and 2 mg of a cationic polymerization initiator (trade name: San-Aid SI-100 L (manufactured by Sanshin Chemical Industry Co., Ltd.)) as a cationic polymerization initiator.

The oxetanyl silsesquioxane used in Example 1 has a structure represented by the following General Formula (18), and it is a mixture of the skeletons of any one of a cage type, a ladder type, a random type, and a partially cleaved cage type.

[Formula 9]

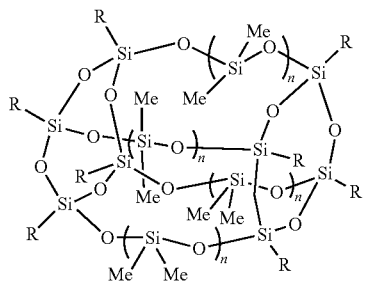

(18)

In the General Formula (18), Me represents a methyl group.

EXAMPLE 2

A resin composition of Example 2 was prepared in the same manner as in Example 1, except that the amount of the nano zirconium oxide dispersion using the metal oxide fine particle modified with an organic group was 7 g.

EXAMPLE 3

A resin composition of Example 3 was prepared in the same manner as in Example 1, except that the amount of the nano zirconium oxide dispersion using the metal oxide fine particle modified with an organic group was 4 g.

COMPARATIVE EXAMPLE 1

A resin composition of Comparative Example 1 was prepared in the same manner as in Example 1, except that the metal oxide fine particle modified with an organic group was not contained.

COMPARATIVE EXAMPLE 2

The components as described below were mixed, and the solvent was removed by means of a rotary evaporator to prepare a resin composition of Comparative Example 2.
<Components>
0.5 g of an A solution of two-pack type methyl phenyl silicone; 0.5 g of a B solution of two-pack type methyl phenyl silicone (the total weight of A solution and B solution being 1 g); and 4 g of a nano zirconium oxide dispersion (trade name: NZD8J61 (manufactured by Sumitomo Osaka Cement Co., Ltd.)) as the metal oxide fine particle modified with an organic group.
[Evaluation of Refractive Index]
The resin compositions of Examples 1 to 3 and Comparative Example 1 obtained in this manner were coated onto a quartz glass wafer by means of a spin coater, heated at 70° C. for 1 hour, and further heated at 150° C. for 3 hours to be cured, and then a resin film was formed on the quartz glass wafer at a thickness of about 10 μm.

Thereafter, the refractive indexes at a wavelength of 460 nm of the resulting resin films of Examples 1 to 3 and Comparative Example 1 were measured by means of a noncontact optical film thickness measurement device (Film Tek 3000: manufactured by SCI). The results are shown in Table 1.

TABLE 1

| | Example 1 | Example 2 | Example 3 | Comparative Example 1 | Comparative Example 2 |
|---|---|---|---|---|---|
| Transparency of cured product | Transparent | Transparent | Transparent | Transparent | White-turbid |
| Refractive index (460 nm) | 1.599 | 1.544 | 1.537 | 1.511 | — (Not measured) |

[Evaluation of Transparency]
Furthermore, as described below, the LED devices were sealed with the resin compositions of Examples 1 to 3 and Comparative Examples 1 and 2 as resin composition 8 to obtain the lamps of Examples 1 to 3, and Comparative Examples 1 and 2, as shown in FIGS. 1A and 1B.

That is, the die attach paste 6 was applied on the second electrode 3b that was exposed to the bottom portion of the sealing member 4a of the package shaped product 4 formed of a polyphthalamide, as shown in FIGS. 1A and 1B, and a surface mount LED device 5 was arranged on the die attach paste 6. Thereafter, the surface mount LED device 5 was adhered on the bottom portion of the sealing member 4a by heating it at 150° C. for 1 hour to cure the die attach paste 6. Thereafter, by carrying out the wire bonding, the anode bonding pad 5a and the cathode bonding pad 5b of the LED device 5 were electrically connected with the first electrode 3a and the second electrode 3b via the wires 7, 7.

Then, as the first electrode 3a and the second electrode 3b, those formed of Cu plated with Ag were used, and as the wires 7, 7, those formed of Au were used.

Then, the liquid droplets of the resin composition 8 were discharged into the inside of sealing member 4a by a dispenser, and filled therein, the resin composition 8 was cured by sequentially carrying out a heat treatment at 80° C. for 1 hour (a first heat treatment) and a heat treatment at 150° C. for 3 hours (a second heat treatment) in an oven, and the sealing was completed to obtain the lamps as shown in FIGS. 1A and 1B. The maximum thickness of the resin composition 8 after curing was 800 μm.

The transparency of the obtained lamp was examined with visual observation. The results are shown in Table 1.

As shown in Table 1, the refractive index was 1.53 or more in Examples 1 to 3, which was higher as compared to Comparative Example 1.

Furthermore, as shown in Table 1, it was confirmed that the resin films of Examples 1 to 3 were excellent in transparency. To the contrary, in Comparative Example 2 in which the resin composition including a two-pack type methyl phenyl silicone and a nano zirconium oxide dispersion had been used, the resin film developed a white turbidity. It is presumed that the zirconium oxide particles in the resin film were aggregated to make secondary particles having larger particle diameters, and the light scattering of the secondary particles made the film to develop white turbidity.

EXAMPLE 4

The components as described below except for the cationic polymerization initiator were mixed, the dispersion solvent was removed by means of a rotary evaporator, or the like, the cationic polymerization initiator mentioned below was added, and the stirring-defoaming process was carried out at 1200 rpm for 5 mins under reduced pressure by means of a vacuum stirring-defoamer to prepare a resin composition of Example 4.

<Components>

0.40 g of oxetanyl silsesquioxane (trade name: OX-SQ-H (manufactured by Toagosei Co., Ltd.)) as the silsesquioxane resin; 0.60 g of an alicyclic epoxy (trade name: Celloxide 2021P (manufactured by Daicel Co., Ltd.)) as the aliphatic hydrocarbon; 14 g of a nano zirconium oxide dispersion (trade name: NZD8J61 (manufactured by Sumitomo Osaka Cement Co., Ltd.)) as the metal oxide fine particle that is modified with an organic group; and 1 mg of a cationic polymerization initiator (trade name: San-Aid SI-100 L (manufactured by Sanshin Chemical Industry Co., Ltd.)) as a cationic polymerization initiator.

Using the resin composition of Example 4 obtained in this manner, the LED device was sealed in the following manner, to obtain the lamp as shown in FIGS. 1A and 1B.

Specifically, the die attach paste 6 was applied on the second electrode 3b that was exposed to the bottom portion of the sealing member 4a of the package shaped product 4 formed of a polyphthalamide, as shown in FIGS. 1A and 1B, and a surface mount LED device 5 was arranged on the die attach paste 6. Thereafter, the surface mount LED device 5 was adhered on the bottom portion of the sealing member 4a by heating it at 150° C. for 1 hour to cure the die attach paste 6. Thereafter, by carrying out the wire bonding, the anode bonding pad 5a and the cathode bonding pad 5b of the LED device 5 were electrically connected with the first electrode 3a and the second electrode 3b via the wires 7, 7.

Then, as the first electrode 3a and the second electrode 3b, those formed of Cu plated with Ag were used, and as the wires 7, 7, those formed of Au were used.

Then, the liquid droplets of the resin composition 8 of Example 4 were discharged into the sealing member 4a by a dispenser, and filled therein, the resin composition 8 was cured by sequentially carrying out a heat treatment at 80° C. for 1 hour (a first heat treatment) and a heat treatment at 150° C. for 3 hours (a second heat treatment) in an oven, and the sealing was completed to obtain the lamps as shown in FIGS. 1A and 1B.

Also, the dispenser as used herein was a dispenser of a flow rate-regulating type in which a liquid sample is put into a syringe equipped with a needle, and discharged using a compressed air from a dispense controller, thereby controlling the pressure and the discharging time.

Similarly, by using the resin of Comparative Example 1, the lamps as shown in FIGS. 1A and 1B were prepared.

20 mA of the forward current was allowed to flow between the first electrode and the second electrode of the obtained two kinds of the lamps, and then the measurement results of the light-emitting output and the forward voltage are shown in Table 2.

TABLE 2

|  | Example 4 | Comparative Example 1 |
| --- | --- | --- |
| Light-emitting output (mW) | 19.3 | 18.5 |
| Forward voltage (V) | 3.29 | 3.36 |

As seen from Table 2, as compared to Comparative Example 1, a lamp having a higher light-emitting output and a lower forward voltage was obtained in Example 4.

INDUSTRIAL APPLICABILITY

According to the resin composition for sealing a light-emitting device of the present invention, a resin composition for sealing a light-emitting device, which is transparent, has a high refractive index, and has excellent light resistance since the cracks are hardly generated during the curing, can be provided.

Furthermore, in the lamp of the present invention, a light-emitting device is sealed with the resin composition for sealing a light-emitting device, and accordingly, the lamp can be prepared in a good product yield, since the cracks are hardly generated during the curing of the sealing resin. Furthermore, in the lamp of the present invention, a light-emitting device is sealed with the resin composition for sealing a light-emitting device that is transparent, has a high refractive index, and has excellent light resistance, and accordingly, the lamp has excellent light extraction efficiency, thereby providing high reliability, which is thus of high industrial value.

The invention claimed is:

1. A resin composition for sealing a light-emitting device comprising:
    a silsesquioxane resin including two or more oxetanyl groups;
    a cationic polymerization initiator;
    an aliphatic hydrocarbon including one or more epoxy groups; and
    a metal oxide fine particle comprising a metal oxide having a refractive index of 1.8 or more.

2. The resin composition for sealing a light-emitting device according to claim 1, wherein the concentration of the metal oxide fine particle in the resin composition for sealing a light-emitting device is in a range of 10 to 80% by mass.

3. The resin composition for sealing a light-emitting device according to claim 1, wherein the average particle diameter of the metal oxide fine particle is in a range of 1 nm to 20 nm.

4. The resin composition for sealing a light-emitting device according to claim 1, wherein the metal oxide fine particle comprises a metal oxide having a transmittance for a visible light emitted by the light-emitting device of 80% or more.

5. The resin composition for sealing a light-emitting device according claim 1, wherein the metal oxide fine particle is surface-modified with an organic group.

6. A lamp comprising a package equipped with a sealing member, an electrode exposed in the bottom portion of the sealing member, and a light-emitting device arranged on the bottom portion and electrically connected with the electrode, wherein
    the light-emitting device is sealed with the resin composition for sealing a light-emitting device filled in the sealing member, and
    the resin composition for sealing a light-emitting device according to claim 1 is used as the resin composition for sealing a light-emitting device.

* * * * *